US008269334B1

(12) United States Patent
Cusack

(10) Patent No.: US 8,269,334 B1
(45) Date of Patent: *Sep. 18, 2012

(54) MULTICHIP PACKAGE LEADFRAME INCLUDING ELECTRICAL BUSSING

(75) Inventor: Michael D. Cusack, Meridian, ID (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/029,574

(22) Filed: Feb. 17, 2011

Related U.S. Application Data

(63) Continuation of application No. 11/695,978, filed on Apr. 3, 2007, now Pat. No. 7,902,655.

(60) Provisional application No. 60/822,439, filed on Aug. 15, 2006.

(51) Int. Cl.
*H01L 23/52* (2006.01)

(52) U.S. Cl. ........ 257/691; 257/666; 257/670; 257/692; 257/E23.004; 257/E23.042; 257/E23.079; 257/E23.141; 361/611; 361/813

(58) Field of Classification Search ................... 257/666, 257/691, 692, E23.004, E23.042, E23.043, 257/E23.079, E23.141, 670; 361/611, 813
See application file for complete search history.

(56) References Cited

U.S. PATENT DOCUMENTS

| 5,998,856 | A | 12/1999 | Noda et al. |
| 6,483,189 | B1 | 11/2002 | Fukunaga |
| 6,903,448 | B1 * | 6/2005 | Sutardja et al. ............... 257/666 |
| 7,008,825 | B1 | 3/2006 | Bancod et al. |
| 2004/0103530 | A1 * | 6/2004 | Adachi et al. .................. 29/854 |
| 2004/0214376 | A1 * | 10/2004 | Gibson et al. ................. 438/123 |
| 2005/0194666 | A1 | 9/2005 | Huang et al. |
| 2007/0045809 | A1 | 3/2007 | Wheless et al. |

* cited by examiner

*Primary Examiner* — Peniel M Gumedzoe

(57) ABSTRACT

Embodiments of the present invention provide electrical bussing for multichip leadframes. In various embodiments, a leadframe may comprise a first die paddle for receiving a first microelectronic device, a second die paddle for receiving a second microelectronic device, and at least one electrical bus disposed between the first die paddle and the second die paddle.

9 Claims, 6 Drawing Sheets

MULTICHIP PACKAGE LEADFRAME
INCLUDING ELECTRICAL BUSSING

CROSS REFERENCE TO RELATED
APPLICATIONS

This application is a continuation of U.S. application Ser. No. 11/695,978, filed Apr. 3, 2007, which claims priority under 35 U.S.C, §119(e) to U.S. Provisional Application No. 60/822,439, filed Aug. 15, 2006. The disclosures of the applications referenced above are incorporated herein by reference.

TECHNICAL FIELD

Embodiments of the present invention relate to the field of integrated circuits, and more particularly, to multichip electronic packages and leadframes.

BACKGROUND

In the current state of integrated circuit technology, an integrated circuit device will often be in the form of a die. Such a die will typically be mounted onto an underlying substrate such as a carrier substrate to form a "package." For example, some packages will include one or more dies coupled to a substrate such as a leadframe, which is frequently made of copper or copper alloy material, and may include a die paddle to support the die.

Interconnecting a die with a leadframe sometimes involves wire bonding. For example, for a quad flat package, bond pads of a die may be wire-bonded on all four sides and the wires may then extend outward from the die to the bond fingers around the periphery of the leadframe.

In multichip packages, wire bonding from those sides of a die that abut another die may be problematic. Long wires are sometimes used to "hurdle" an intermediate die (that is, a die lying between a bond finger and the die to which interconnection is being made). Long wires may result in shorting if wires were to touch during subsequent operations (e.g., during encapsulation). Even if shorting were avoided, long wires may still be undesirable due to increased signal transmission time.

Certain efforts have been made to remedy these problems. For example, micro-printed circuit boards (PCB) are sometimes placed underneath one or more dies to provide an interconnection pathway. In these situations, a die may be coupled to the PCB and the other side of the PCB may be coupled to a bond finger. Unfortunately, this process is expensive, complex, and time-consuming. Sometimes, multichip packages are forgone altogether, and single-chip packages are used instead. This "solution," however, simply adds cost, in terms of time and money, to packaging operations.

SUMMARY OF THE INVENTION

In various embodiments in accordance with the present invention, a leadframe is provided. In various ones of these embodiments, the leadframe may comprise a first die paddle for receiving a first microelectronic device; a second die paddle for receiving a second microelectronic device; and at least one electrical bus disposed between the first die paddle and the second die paddle and configured to supply a potential to at least one of the first and second microelectronic devices.

In some embodiments, the electrical bus may be one of a power bus configured to supply a power-supply potential and a ground bus configured to supply a ground potential. In some embodiments, at least one of the first and second die paddles may be one of a ground bus configured to supply a ground potential and a power bus configured to supply a power-supply potential.

In some embodiments, the leadframe may further comprise a third die paddle for receiving a third microelectronic die. In various ones of these embodiments, the leadframe may further comprise at least one other electrical bus disposed between the third die paddle and one or more of the first die paddle and the second die paddle.

According to some embodiments, an electronic package may include a leadframe comprising a first die paddle having a first microelectronic device mounted thereon, and a second die paddle having a second microelectronic device mounted thereon. In some embodiments, the electronic package may further comprise at least one electrical bus disposed between the first die paddle and the second die paddle, and electrically interconnected with at least one of the first microelectronic device and the second microelectronic device.

In various embodiments, the electronic package may further include a third die paddle having a third microelectronic device mounted thereon. In some of these embodiments, the electronic package may further comprise at least one other electrical bus disposed between the third die paddle and one or more of the first die paddle and the second die paddle.

In various embodiments, the electronic package may further comprise an encapsulant material encapsulating at least the first microelectronic device and the second microelectronic device.

In some embodiments, the electronic package may further comprise at least one bonding wire electrically interconnecting the first microelectronic device and the second microelectronic device with at least one of the first die paddle and the second die paddle. In various embodiments, the electronic package may comprise at least one bonding wire electrically interconnecting the first microelectronic device and the second microelectronic device with the electrical bus.

In various embodiments, the electronic package may be incorporated into a system. For example, in various embodiments, the system may comprise an electronic package including a leadframe including a first die paddle having a first microelectronic device mounted thereon; a second die paddle having a second microelectronic device mounted thereon; and at least one electrical bus disposed between the first die paddle and the second die paddle and configured to supply a potential to at least one of the first and second microelectronic devices.

In some embodiments, the system may further comprise a power supply to provide a voltage to the electronic package.

In still further embodiments, the system may further comprise a direct current to direct current (DC-DC) converter coupled to a power supply and an electronic package, the DC-DC converter configured to regulate a voltage provided to the electronic package.

In some embodiments, the system may comprise one of a group comprising a mobile phone, a laptop computer, a personal digital assistant, a gaming device, a music player, a video player, a printer, a set-top box, a desktop computing device, and an entertainment control unit.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which are illustrated by way of illustrative embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the present invention, the phrase "NB" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is, A is an optional element.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

The terms chip, integrated circuit, monolithic device, semiconductor device, and microelectronic device are often used interchangeably in the microelectronics field. The present invention is applicable to all the above as they are generally understood in the field.

Embodiments of the present invention are directed to multichip leadframes, multichip electronic packages endowed with leadframes, and systems endowed with multichip electronic packages.

Figure 1:
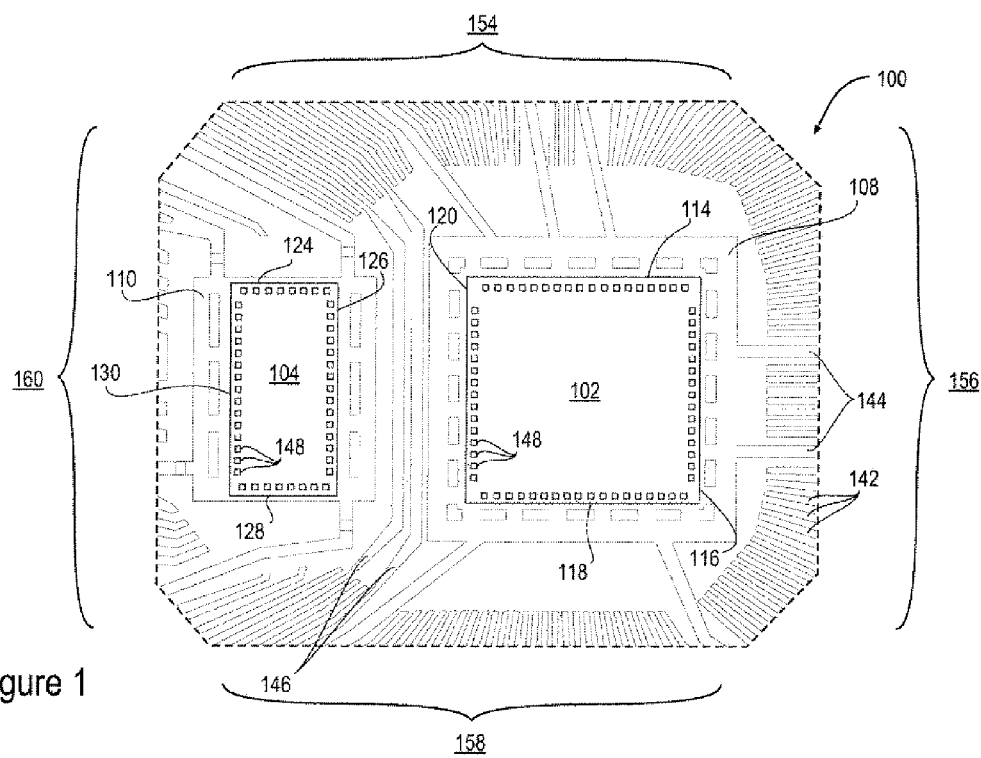
FIG. 1 illustrates a plan view of an electronic package in accordance with various embodiments of the present invention.
Figure 2:
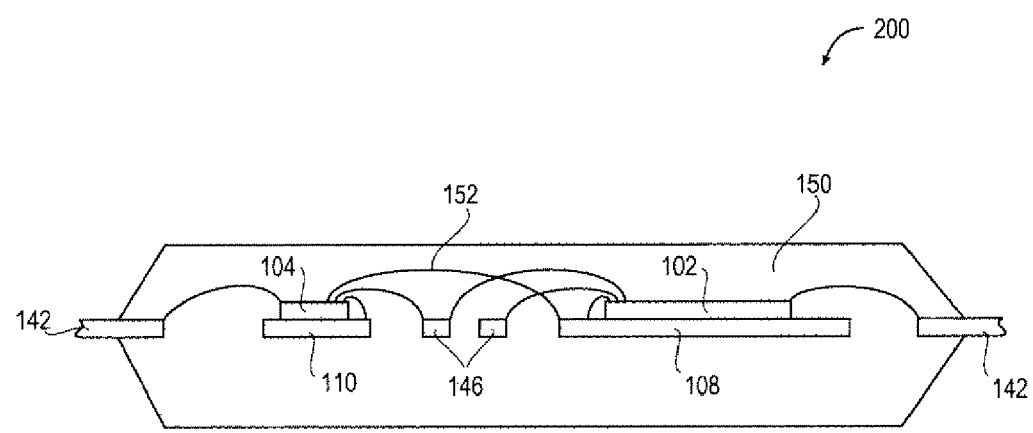
FIG. 2 illustrates a side view of the electronic package of FIG. 1 in accordance with various embodiments of the present invention.

An exemplary electronic package, in accordance with various embodiments of the present invention, is illustrated in FIGS. 1 and 2. As illustrated, an electronic package may comprise a leadframe 100, die paddles 108, 110, and microelectronic devices 102, 104. Microelectronic devices 102, 104 may be mounted onto die paddles 108, 110, respectively. In various embodiments, one or more of microelectronic devices 102, 104 may be mounted onto die paddles 108, 110 using a nonconductive adhesive or film. A nonconductive adhesive or film may be used, for example, if electrical isolation is desired between a die paddle and a microelectronic device mounted thereon. In various other embodiments, however, one or more of microelectronic devices 102, 104 may be mounted onto a die paddle using a conductive adhesive or film, depending on the application.

One or both of die paddles 108,110 may include support bars 144 (sometimes referred to in the art as tie bars). Support bars 144 may provide support for the corresponding die paddle during, for example, an assembly process. In general, die paddles 108, 110 may be used for providing structural support for microelectronic devices 102, 104 mounted thereon, and sometimes, die paddles 108, 110 may serve as a common potential source (e.g., ground or power supply). Thus, it may sometimes be necessary or desirable to mount microelectronic devices 102, 104 on separate die paddles 108, 110 (as illustrated) as opposed to mounting microelectronic devices 102, 104 onto a single die paddle. It should be noted that although the illustrated embodiment depicts two microelectronic devices 102, 104, it is contemplated that any number of microelectronic devices in any configuration may be included in an electronic package in accordance with various embodiments. For example, microelectronic devices may be stacked and/or may be variously arranged on the leadframe (as opposed to the illustrated linear arrangement).

Leadframe 100 includes bond fingers 142 for interconnection between microelectronic devices 102, 104 and the outside of the electronic package (e.g., when mounting the electronic package to a printed circuit board). Bond fingers 142 may be alternatively referred to in the art as leads or lead fingers. Bond fingers 142 may be electrically isolated, and may be coupled to or form external leads for coupling the electronic package to another device, for example. For making interconnections, microelectronic devices 102, 104 may include bond pads 148 to which interconnecting wires may be bonded. For example, as illustrated in FIG. 2, microelectronic devices 102, 104 may be interconnected to bond fingers 142 using wires 152. In various embodiments, microelectronic devices 102, 104 may include bond pads 148 for any one or more of various interconnection purposes including, for example, inputting and/or outputting signals, providing a ground potential, and providing a power-supply potential.

As illustrated in FIG. 1, leadframe 100 includes bond fingers 142 around its periphery. As illustrated, bond fingers are disposed along top edge 154, right edge 156, bottom edge 158, and left edge 160 of leadframe 100. This arrangement may be used in an electronic package sometimes referred to in the art as a quad flat package. As discussed above, it may be necessary to make electrical interconnections between microelectronic devices 102, 104 and bond fingers 142. As illustrated, making such interconnections between top edge 114, right edge 116, and bottom edge 118 of microelectronic device 102 and bond fingers 142 may be a generally straightforward endeavor. With respect to left edge 120, however, interconnection between bond pads 148 on left edge 120 of microelectronic device 102 and the bond fingers 142 along left edge 160 of leadframe 100 may be more problematic due to the fact that one or more wires would have to span the distance over microelectronic device 104. Similarly, making interconnections between top edge 124, left edge 130, and bottom edge 128 of microelectronic device 104 and bond fingers 142 may be a generally straightforward endeavor. With respect to right edge 126, however, interconnection between bond pads 148 on right edge 126 of microelectronic device 104 and the bond fingers 142 along right edge 156 of leadframe 100 may be problematic due to the fact that one or more wires would have to span the distance over microelectronic device 102. As a result, shorting may occur due to, for example, wires inadvertently touching each other or other elements of the electronic package. Shorting may be particularly likely to occur during subsequent packaging processes including, for example, encapsulation, during which the flow of encapsulant may cause the wires to move with the flow of encapsulant material.

Long wires may be avoided according to various embodiments of the present invention. In various embodiments, leadframe 100 may include one or more electrical busses 146 to which one or more of microelectronic devices 102, 104 may be interconnected rather than extending wires over an intermediate microelectronic device. As illustrated, electrical busses 146 are disposed between die paddle 108 and die paddle 110. In the arrangement of this embodiment, one or more bond pads 148 disposed along left edge 120 of microelectronic device 102 and/or right edge 126 of microelectronic device 104 may be interconnected with one or more of electrical busses 146.

Electrical busses 146 may be variously configured. For example, in various embodiments, one or more of electrical busses 146 may be configured to supply any potential, depending on the application. In some of these embodiments, one or more of the electrical busses 146 may be configured to supply a potential selected from a ground potential and a power-supply potential. For example, one of the electrical busses 146 could be configured to supply a potential of 1.2 volts and another one of the electrical busses 146 could be configured to supply a ground potential (e.g., quiet ground $V_{SSQ}$ or digital ground $V_{SSD}$). In various other embodiments, however, any one or more other potentials may be used, usually depending on the application. In any event, electrical busses 146 may permit shorter wires to be used for electrical interconnections and in some cases, shorter wires may result in a decreased likelihood of shorting and/or decreased transmission time for signals. One or more other advantages may accrue by using shorter wires including, for example, minimization of power dissipation, reduced resistance, reduced inductance, and reduced heat generation.

In various embodiments, one or more of die paddles 108, 110 may be configured to provide electrical bussing to which one or more of microelectronic devices 102, 104 may be interconnected. Any one or more bond pads 148 of microelectronic devices 102, 104 may be interconnected with one or more die paddles 108, 110 so configured. One or more of die paddles 108, 110 may be configured to supply any potential, depending on the application. For example, in some embodiments, one or more of the die paddles 108, 110 may be configured to supply a potential selected from a ground potential and a power-supply potential. For example, one of the die paddles 108, 110 could be configured to supply a potential of 1.2 volts and another one of the die paddles 108,110 could be configured to supply a ground potential (e.g., quiet ground $V_{SSQ}$ or digital ground $V_{SSD}$). In various other embodiments, however, any one or more other potentials may be used, usually depending on the application. In any event, die paddles configured to supply a potential may accrue similar advantages provided by electrical busses 146 in that interconnection may be made to one or more of the die paddles, rather than spanning an intermediate microelectronic device (and/or other elements of the electronic package) permitting shorter wires to be used.

Illustrated in FIG. 2 is a side view of the electronic package of FIG. 1. As illustrated, electronic package 200 includes die paddles 108, 110, microelectronic devices 102, 104, bond fingers 142, and electrical busses 146. Microelectronic devices 102, 104 may be interconnected by wires 152 to any one or more of bond fingers 142, bond pads 148, one or more of electrical busses 146, and/or one or more of die paddles 108, 110, depending on the application. Electronic package 200 may include an encapsulant material 150 encapsulating at least microelectronic devices 102, 104. In various ones of these embodiments, microelectronic devices 102, 104, die paddles 108, 110, and wires 152 may be encapsulated by encapsulant material 150, as illustrated, depending on the application. Electronic package 200 as illustrated may sometimes be referred to in the art as a quad flat package.

Figure 3:
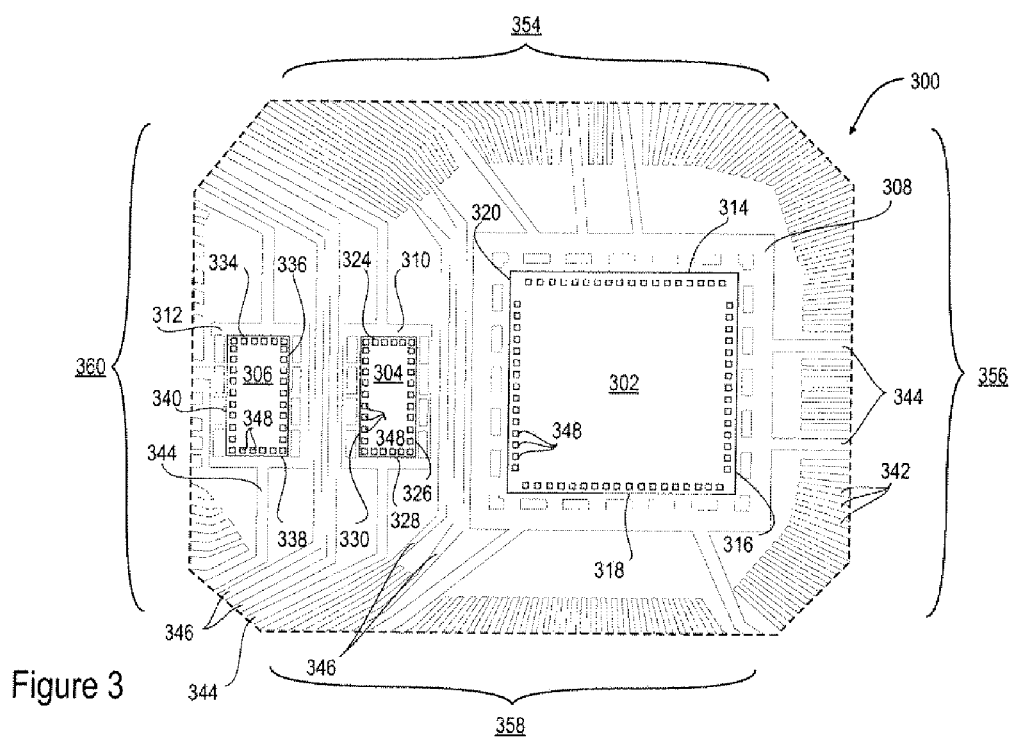
FIG. 3 illustrates a plan view of an electronic package in accordance with various embodiments of the present invention.
Figure 4:
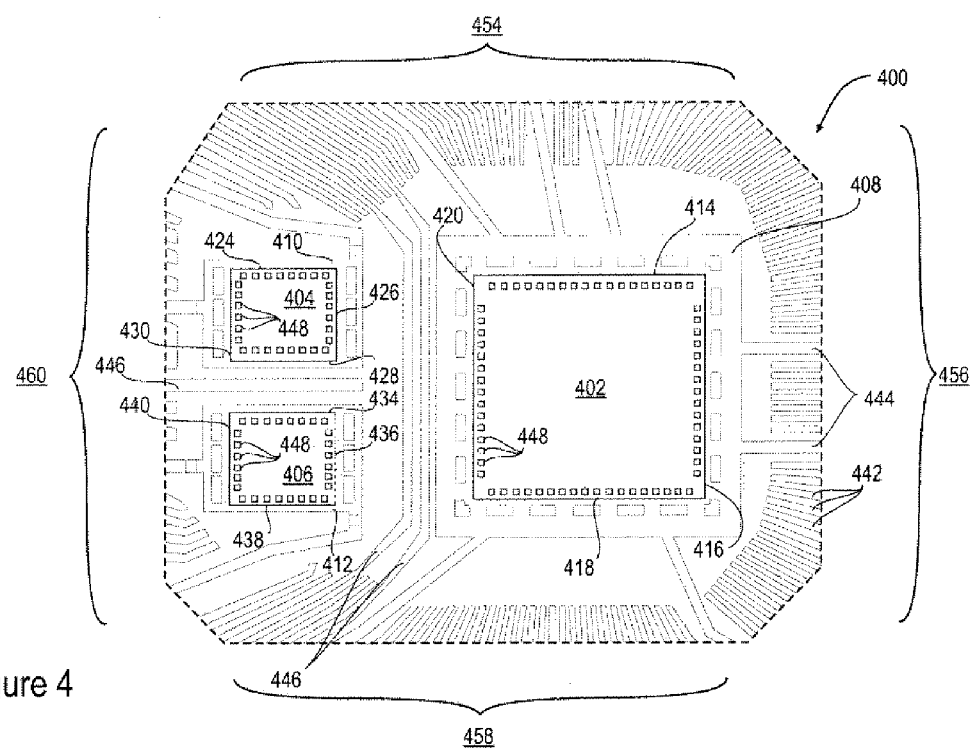
FIG. 4 illustrates a plan view of an electronic package in accordance with various embodiments of the present invention.
Figure 5:
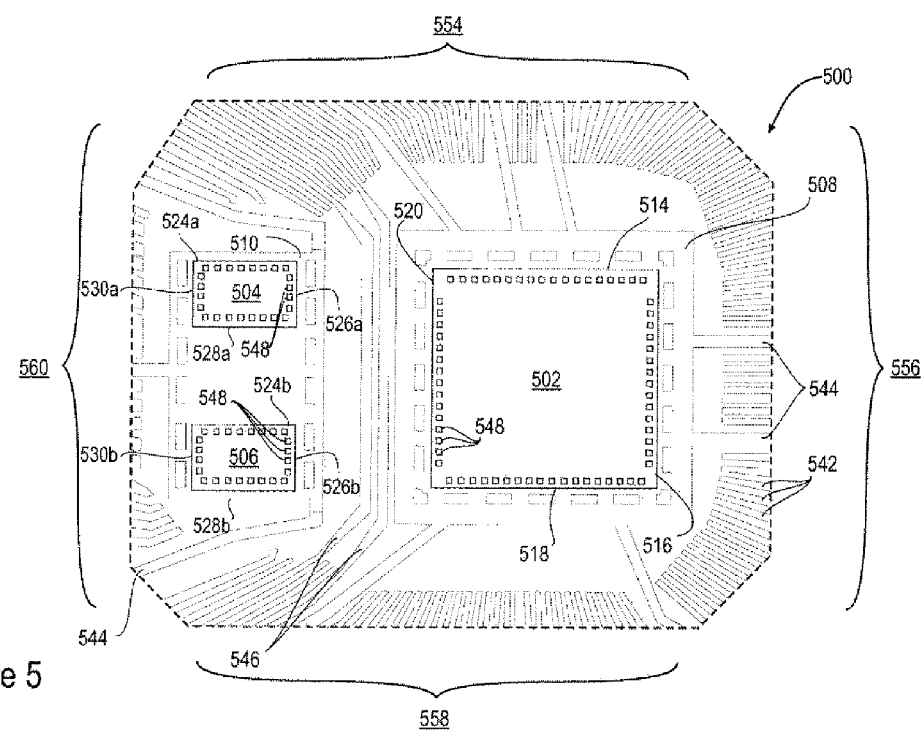
FIG. 5 illustrates a plan view of an electronic package in accordance with various embodiments of the present invention.

Turning now to FIGS. 3, 4, and 5, illustrated are various embodiments of the present invention. As illustrated in FIG. 3, leadframe 300 may include multiple microelectronic devices 302, 304, 306 and multiple die paddles 308, 310, 312, each microelectronic device 302, 304, 306 mounted on a separate one of die paddles 308, 310, 312. Electrical busses 346 may be disposed between each of die paddles 308, 310, 312. Microelectronic devices 302, 304, 306 may be mounted onto die paddles 308, 310, 312, respectively. In various embodiments, one or more of microelectronic devices 302, 304, 306 may be mounted onto die paddles 308, 310, 312 using a nonconductive adhesive or film. In various other embodiments, however, one or more of microelectronic devices 302, 304, 306 may be mounted onto a die paddle using a conductive adhesive or film, depending on the application.

One or more of die paddles 308, 310, 312 may include support bars 344. Support bars 344 may provide support for the corresponding die paddle during, for example, an assembly process. In general, die paddles 308, 310, 312 may be used for providing structural support for microelectronic devices 302, 304, 306 mounted thereon, and sometimes, one or more of die paddles 308, 310, 312 may serve as a common potential source (e.g., ground or power supply). Thus, it may sometimes be necessary or desirable to mount microelectronic devices 302, 304, 306 onto separate die paddles 308, 310, 312 (as illustrated) as opposed to mounting microelectronic devices 302, 304, 306 onto a single die paddle. It should be noted that although the illustrated embodiment depicts three microelectronic devices 302, 304, 306, it is contemplated that any number of microelectronic devices in any configuration may be included in an electronic package in accordance with various embodiments. For example, microelectronic devices may be stacked and/or may be variously arranged on the leadframe (as opposed to the illustrated linear arrangement).

Leadframe 300 includes bond fingers 342 for interconnection between microelectronic devices 302, 304, 306 and the outside of the electronic package (e.g., when mounting the electronic package to a printed circuit board). Bond fingers 342 may be alternatively referred to in the art as leads or lead fingers. Bond fingers 342 may be electrically isolated, and may be coupled to or form external leads for coupling the electronic package to another device, for example. For making interconnections, microelectronic devices 302, 304, 306 may include bond pads 348 to which interconnecting wires may be bonded (e.g., as illustrated in FIG. 2, discussed previously). In various embodiments, microelectronic devices 302, 304, 306 may include bond pads 348 for any one or more of various interconnection purposes including, for example, inputting and/or outputting signals, providing a ground potential, and providing a power-supply potential.

As in various embodiments previously discussed, an electronic package including one or more electrical busses 346 may allow for shorter wires to be used when making interconnections. As illustrated, making such interconnections between top edge 314 of microelectronic device 302 and bond fingers 342 along top edge 354 of leadframe 300, between right edge 316 of microelectronic device 302 and right edge 356 of leadframe 300, and bottom edge 318 of microelectronic device 302 and bottom edge 358 of leadframe 300 may be a generally straightforward endeavor. With respect to left edge 320, however, interconnection between bond pads 348 on left edge 320 of microelectronic device 302 and the bond fingers 342 along left edge 360 of leadframe 300 may be more problematic due to the fact that one or more wires would have to span the distance over microelectronic devices 304, 306. Similarly, left edge 330 and right edge 326 of microelectronic device 304 may require the use of longer wires relative to top edge 324 and bottom edge 328, and right edge 336 of microelectronic device 306 may require the use of longer wires relative to top edge 334, left edge 340 and bottom edge 338.

In the embodiment illustrated in FIG. 3, one or more of microelectronic devices 302, 304, 306 could instead (or in addition to, depending on the application) be interconnected with one or more of electrical busses 346 which may allow for the use of shorter wires. Electrical busses 346 may be variously configured. For example, in various embodiments, one or more of electrical busses 346 may be configured to supply any potential, depending on the application. In some of these embodiments, one or more of the electrical busses 346 may be configured to supply a potential selected from a ground potential and a power-supply potential. For example, one of the electrical busses 346 could be configured to supply a potential of 1.2 volts and another one of the electrical busses 346 could be configured to supply a ground potential (e.g., quiet ground $V_{SSQ}$ or digital ground $V_{SSD}$). In various other embodiments, however, any one or more other potentials may be used, usually depending on the application. In any event, electrical busses 346 may permit shorter wires to be used for electrical interconnections and in some cases, shorter wires may result in a decreased likelihood of shorting and/or decreased transmission time for signals. One or more other advantages may accrue by using shorter wires including, for example, minimization of power dissipation, reduced resistance, reduced inductance, and reduced heat generation.

In various embodiments, one or more of die paddles 308, 310, 312 may be configured to provide electrical bussing to which one or more of microelectronic devices 302, 304, 306 may be interconnected. One or more of die paddles 308, 310, 312 may be configured to supply any potential, depending on the application. For example, in some embodiments, one or more of the die paddles 308, 310, 312 may be configured to supply a potential selected from a ground potential and a power-supply potential. For example, one of the die paddles 308, 310, 312 could be configured to supply a potential of 1.2 volts and another one of the die paddles 308, 310, 312 could be configured to supply a ground potential (e.g., quiet ground $V_{SSQ}$ or digital ground $V_{SSD}$). In various other embodiments, however, any one or more other potentials may be used, usually depending on the application. In any event, die paddles configured to supply a potential may accrue similar advantages provided by electrical busses 346 in that interconnection may be made to one or more of the die paddles, rather than spanning an intermediate microelectronic device (and/or other elements of the electronic package) permitting shorter wires to be used.

In other embodiments and as illustrated in FIG. 4, die paddles and microelectronic devices may be variously arranged. As illustrated in FIG. 4, leadframe 400 may include multiple microelectronic devices 402, 404, 406 and multiple die paddles 408, 410, 412, each microelectronic device 402, 404, 406 mounted on a separate one of die paddles 408, 410, 412. As illustrated, one or more electrical busses 446 may be disposed between die paddle 410 and die paddle 412, and other electrical busses 446 may be disposed between die paddles 410, 412 and die paddle 408. In various other embodiments, more or less die paddles may be included, and die paddles may be variously arranged on leadframe 400 depending on the application. In various embodiments, one or more of microelectronic devices 402, 404, 406 may be mounted onto die paddles 408, 410, 412 using a nonconductive adhesive or film. In various other embodiments, however, one or more of microelectronic devices 402, 404, 406 may be mounted onto a die paddle using a conductive adhesive or film, depending on the application.

One or more of die paddles 408, 410, 412 may include support bars 444. Support bars 444 may provide support for the corresponding die paddle during, for example, an assembly process. In general, die paddles 408, 410, 412 may be used for providing structural support for microelectronic devices 402, 404, 406 mounted thereon, and sometimes, one or more of die paddles 408, 410, 412 may serve as a common potential source (e.g., ground or power supply). Thus, it may sometimes be necessary or desirable to mount microelectronic devices 402, 404, 406 on separate die paddles 408, 410, 412 (as illustrated) as opposed to mounting microelectronic devices 402, 404, 406 onto a single die paddle. It should be noted that although the illustrated embodiment depicts three microelectronic devices 402, 404, 406, it is contemplated that any number of microelectronic devices in any configuration may be included in an electronic package in accordance with various embodiments. For example, microelectronic devices may be stacked and/or may be variously arranged on the leadframe (as opposed to the illustrated linear arrangement).

Leadframe 400 includes bond fingers 442 for interconnection between microelectronic devices 402, 404, 406 and the outside of the electronic package (e.g., when mounting the electronic package to a printed circuit board). Bond fingers 442 may be alternatively referred to in the art as leads or lead fingers. Bond fingers 442 may be electrically isolated, and may be coupled to or form external leads for coupling the electronic package to another device, for example. For making interconnections, microelectronic devices 402, 404, 406 may include bond pads 448 to which interconnecting wires may be bonded (e.g., as illustrated in FIG. 2, discussed previously). In various embodiments, microelectronic devices 402, 404, 406 may include bond pads 448 for any one or more of various interconnection purposes including, for example, inputting and/or outputting signals, providing a ground potential, and providing a power-supply potential.

As in various embodiments previously discussed, an electronic package including one or more electrical busses 446 may allow for shorter wires to be used when making interconnections. As illustrated, making such interconnections between top edge 414 of microelectronic device 402 and bond fingers 442 along top edge 454 of leadframe 400, between right edge 416 of microelectronic device 402 and right edge 456 of leadframe 400, and bottom edge 418 of microelectronic device 402 and bottom edge 458 of leadframe 400 may be a generally straightforward endeavor. With respect to left edge 420, however, interconnection between bond pads 448 on left edge 420 of microelectronic device 402 and the bond fingers 442 along left edge 460 of leadframe 400 may be more problematic due to the fact that one or more wires would have to span the distance over one or both of microelectronic devices 404, 406. Similarly, right edge 426 and bottom edge 428 of microelectronic device 404 may require the use of longer wires relative to left edge 430 and top edge 424, and top edge 434 and right edge 436 of microelectronic device 406 may require the use of longer wires relative to left edge 440 and bottom edge 438.

In the embodiment illustrated in FIG. 4, one or more of microelectronic devices 402, 404, 406 could instead (or in addition to, depending on the application) be interconnected with one or more of electrical busses 446, which may allow for the use of shorter wires. Electrical busses 446 may be variously configured. For example, in various embodiments, one or more of electrical busses 446 may be configured to supply any potential, depending on the application. In some of these embodiments, one or more of the electrical busses 446 may be configured to supply a potential selected from a ground potential and a power-supply potential. For example, one of the electrical busses 446 could be configured to supply a potential of 1.2 volts and another one of the electrical busses 446 could be configured to supply a ground potential (e.g., quiet ground $V_{SSQ}$ or digital ground $V_{SSD}$). In various other embodiments, however, any one or more other potentials may be used, usually depending on the application. In any event, electrical busses 446 may permit shorter wires to be used for electrical interconnections and in some cases, shorter wires may result in a decreased likelihood of shorting and/or decreased transmission time for signals. One or more other advantages may accrue by using shorter wires including, for example, minimization of power dissipation, reduced resistance, reduced inductance, and reduced heat generation.

In various embodiments, one or more of die paddles 408, 410, 412 may be configured to provide electrical bussing to which one or more of microelectronic devices 402, 404, 406 may be interconnected. One or more of die paddles 408, 410, 412 may be configured to supply any potential, depending on the application. For example, in some embodiments, one or more of the die paddles 408, 410, 412 may be configured to supply a potential selected from a ground potential and a power-supply potential. For example, one of the die paddles 408, 410, 412 could be configured to supply a potential of 1.2 volts and another one of the die paddles 408, 410, 412 could be configured to supply a ground potential (e.g., quiet ground $V_{SSQ}$ or digital ground $V_{SSD}$). In various other embodiments, however, any one or more other potentials may be used, usually depending on the application. In any event, die paddles configured to supply a potential may accrue similar advantages provided by electrical busses 446 in that interconnection may be made to one or more of the die paddles, rather than spanning an intermediate microelectronic device (and/or other elements of the electronic package) permitting shorter wires to be used.

In still another embodiment and as illustrated in FIG. 5, two microelectronic devices 504, 506 are mounted on die paddle 510 and electrical busses 546 are disposed between die paddle 510 and die paddle 508. In various other embodiments, more or less die paddles may be included, and die paddles may be variously arranged on leadframe 500 depending on the application. In various embodiments, one or more of microelectronic devices 502, 504, 506 may be mounted onto die paddles 508, 510 using a nonconductive adhesive or film. In various other embodiments, however, one or more of microelectronic devices 502, 504, 506 may be mounted onto a die paddle using a conductive adhesive or film, depending on the application.

One or more of die paddles 508, 510 may include support bars 544. Support bars 544 may provide support for the corresponding die paddle during, for example, an assembly process. In general, die paddles 508, 510 may be used for providing structural support for microelectronic devices 502, 504, 506 mounted thereon, and sometimes, one or more of die paddles 508, 510 may serve as a common potential source (e.g., ground or power supply). It should be noted that although the illustrated embodiment depicts three microelectronic devices 502, 504, 506, it is contemplated that any number of microelectronic devices in any configuration may be included in an electronic package in accordance with various embodiments. For example, microelectronic devices may be stacked and/or may be variously arranged on the leadframe (as opposed to the illustrated linear arrangement).

Leadframe 500 includes bond fingers 542 for interconnection between microelectronic devices 502, 504, 506 and the outside of the electronic package (e.g., when mounting the electronic package to a printed circuit board). Bond fingers 542 may be alternatively referred to in the art as leads or lead fingers. Bond fingers 542 may be electrically isolated, and may be coupled to or form external leads for coupling the electronic package to another device, for example. For making interconnections, microelectronic devices 502, 504, 506 may include bond pads 548 to which interconnecting wires may be bonded (e.g., as illustrated in FIG. 2, discussed previously). In various embodiments, microelectronic devices 502, 504, 506 may include bond pads 548 for any one or more of various interconnection purposes including, for example, inputting and/or outputting signals, providing a ground potential, and providing a power-supply potential.

As in various embodiments previously discussed, an electronic package including one or more electrical busses 546 may allow for shorter wires to be used when making interconnections. As illustrated, making such interconnections between top edge 514 of microelectronic device 502 and bond fingers 542 along top edge 554 of leadframe 500, between right edge 516 of microelectronic device 502 and right edge 556 of leadframe 500, and bottom edge 518 of microelectronic device 502 and bottom edge 558 of leadframe 500 may be a generally straightforward endeavor. With respect to left edge 520, however, interconnection between bond pads 548 on left edge 520 of microelectronic device 502 and the bond fingers 542 along left edge 560 of leadframe 500 may be more problematic due to the fact that one or more wires would have to span the distance over die paddle 510. Similarly, right edge 526a, 526b, respectively, of microelectronic devices 504,506 may require the use of longer wires relative to top edge 524a, 524b, left edge 530a, 530b, and bottom edge 528a, 528b.

In the illustrated embodiment, one or more of microelectronic devices 502, 504, 506 could instead (or in addition to, depending on the application) be interconnected with one or more of electrical busses 546 which may allow for the use of shorter wires. Electrical busses 546 may be variously configured. For example, in various embodiments, one or more of electrical busses 546 may be configured to supply any potential, depending on the application. In some of these embodiments, one or more of the electrical busses 546 may be configured to supply a potential selected from a ground potential and a power-supply potential. For example, one of the electrical busses 546 could be configured to supply a potential of 1.2 volts and another one of the electrical busses 546 could be configured to supply a ground potential (e.g., quiet ground $V_{SSQ}$ or digital ground $V_{SSD}$). In various other embodiments, however, any one or more other potentials may be used, usually depending on the application. In any event, electrical busses 546 may permit shorter wires to be used for electrical interconnections and in some cases, shorter wires may result in a decreased likelihood of shorting and/or decreased transmission time for signals. One or more other advantages may accrue by using shorter wires including, for example, minimization of power dissipation, reduced resistance, reduced inductance, and reduced heat generation.

In various embodiments, one or more of die paddles 508, 510 may be configured to provide electrical bussing to which one or more of microelectronic devices 502, 504, 506 may be interconnected. One or more of die paddles 508, 510 may be configured to supply any potential, depending on the application. For example, in some embodiments, one or more of the die paddles 508, 510 may be configured to supply a potential selected from a ground potential and a power-supply potential. For example, one of the die paddles 508, 510 could be configured to supply a potential of 1.2 volts and another one of the die paddles 508, 510 could be configured to supply a ground potential (e.g., quiet ground $V_{SSQ}$ or digital ground $V_{SSD}$). In various other embodiments, however, any one or more other potentials may be used, usually depending on the application. In any event, die paddles configured to supply a potential may accrue similar advantages provided by electrical busses 546 in that interconnection may be made to one or more of the die paddles, rather than spanning an intermediate microelectronic device (and/or other elements of the electronic package) permitting shorter wires to be used.

Figure 6:
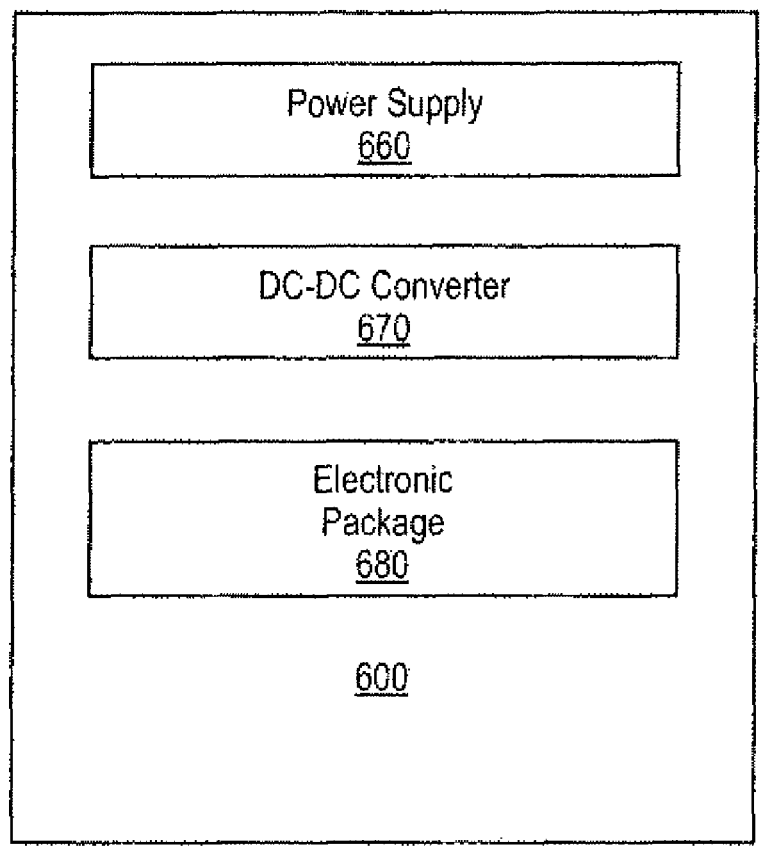
FIG. 6 illustrates a system in accordance with various embodiments of the present invention.

Various embodiments of the present invention may be employed for all types of systems that use electronic packages including leadframes. An exemplary embodiment of a system is illustrated in FIG. 6. As illustrated, system 600 may include a power supply 660, a direct-current to direct-current (DC-DC) converter 670, and an electronic package 680 including a leadframe with one or more electrical busses. In various embodiments, system 600 may represent general purpose and/or special purpose data processing systems, including personal computers, consumer electronic devices, and/or communications devices. For example, in exemplary embodiments, a leadframe in accordance with various embodiments may be used in portable electronic devices, such as, for example, mobile phones, laptop computers, personal digital assistants, gaming devices, music players, and video players. In various other exemplary embodiments, a leadframe may be used in stationary electronic devices, such as, for example, printers (e.g., digital printers), set-top boxes, desktop computing devices, and entertainment control units.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An electronic package comprising:
a leadframe including (i) a first die paddle, (ii) a second die paddle, (iii) a first edge defining a first terminating boundary of the leadframe, and (iv) a second edge opposite the first edge, wherein the second edge defines a second terminating boundary of the leadframe;
a first microelectronic device mounted on the first die paddle;
a second microelectronic device mounted on the second die paddle; and
a plurality of electrical busses disposed between the first die paddle and the second die paddle, the plurality of electrical busses being electrically interconnected with at least one of the first microelectronic device and the second microelectronic device,
wherein each of the plurality of electrical busses form a contiguous structure between the first edge and the second edge of the leadframe,
wherein a first electrical bus of the plurality of electrical busses is a power bus supplying a power-supply potential,
wherein a second electrical bus of the plurality of electrical busses is a ground bus supplying a ground potential, and
wherein the plurality of electrical busses do not include a die paddle.

2. The electronic package of claim 1, further comprising a first bonding wire electrically interconnecting (i) the first microelectronic device and (ii) the second microelectronic device with the first electrical bus; and
a second bonding wire electrically interconnecting (i) the first microelectronic device and (ii) the second microelectronic device with the second electrical bus.

3. The electronic package of claim 1, wherein the leadframe further includes a third die paddle, wherein a third microelectronic device is mounted on the third die paddle.

4. The electronic package of claim 1, further comprising a third microelectronic device mounted on one of the first die paddle and the second die paddle.

5. The electronic package of claim 1, further comprising an encapsulant material encapsulating at least the first microelectronic device and the second microelectronic device.

6. The electronic package of claim 1, wherein the electronic package is a quad flat package.

7. A leadframe comprising:
a first die paddle to receive a first microelectronic device;
a second die paddle to receive a second microelectronic device;
a plurality of electrical busses disposed between the first die paddle and the second die paddle, a first electrical bus of the plurality of electrical busses supplying a potential to at least one of the first and second microelectronic devices, and a second electrical bus of the plurality of electrical busses supplying a ground potential;
a first edge defining a first terminating boundary of the leadframe; and
a second edge opposite the first edge, the second edge defining a second terminating boundary of the leadframe,
wherein each of the plurality of electrical busses forms a contiguous structure between the first edge and the second edge of the leadframe, and
wherein the plurality of electrical busses do not include a die paddle.

8. A system comprising:
an electronic package including
a leadframe including (i) a first die paddle, (ii) a second die paddle, (iii) a first edge defining a first terminating boundary of the leadframe, and (iv) a second edge opposite the first edge, wherein the second edge defines a second terminating boundary of the leadframe,
a plurality of electrical busses disposed between the first die paddle and the second die paddle, each of the plurality of electrical busses forming a contiguous structure between the first edge and the second edge of the leadframe, wherein the plurality of electrical busses do not include a die paddle, a first microelectronic device mounted on the first die paddle, and a second microelectronic device mounted on the second die paddle, wherein a first electrical bus of the plurality of electrical busses is a power bus supplying a power-supply potential, wherein a second electrical bus of the plurality of electrical busses is a ground bus supplying a ground potential, and wherein at least one of the first microelectronic device and the second microelectronic device is electrically coupled to at least one of the first electrical bus and the second electrical bus;

a power supply to provide a voltage to the electronic package; and a direct current to direct current (DC-DC) converter coupled to (i) the power supply and (ii) the electronic package, the DC-DC converter to regulate a voltage provided to the electronic package.

9. The system of claim 8, wherein the system comprises one of a group comprising a mobile phone, a laptop computer, a personal digital assistant, a gaming device, a music player, a video player, a printer, a set-top box, a desktop computing device, and an entertainment control unit.

\* \* \* \* \*